US010211276B2

(12) United States Patent
Choi et al.

(10) Patent No.: US 10,211,276 B2
(45) Date of Patent: Feb. 19, 2019

(54) DISPLAY DEVICE INCLUDING AN ORGANIC LAYER HAVING AN UNEVEN SURFACE WITH A PLURALITY OF PROTRUSIONS IN A BENDING AREA

(71) Applicant: SAMSUNG DISPLAY CO., LTD., Yongin-si, Gyeonggi-Do (KR)

(72) Inventors: Yoonsun Choi, Yongin-si (KR); Wonsuk Choi, Yongin-si (KR); Cheolsu Kim, Yongin-si (KR); Sangjo Lee, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/270,416

(22) Filed: Sep. 20, 2016

(65) Prior Publication Data

US 2017/0271617 A1    Sep. 21, 2017

(30) Foreign Application Priority Data

Mar. 17, 2016 (KR) .................. 10-2016-0032074

(51) Int. Cl.
  *H01L 27/32* (2006.01)
  *H01L 51/52* (2006.01)
  *H01L 51/00* (2006.01)

(52) U.S. Cl.
  CPC ...... *H01L 27/3276* (2013.01); *H01L 27/3244* (2013.01); *H01L 51/0097* (2013.01); *H01L 51/5246* (2013.01); *H01L 51/5253* (2013.01); *H01L 2251/5338* (2013.01); *Y02E 10/549* (2013.01)

(58) Field of Classification Search
  None
  See application file for complete search history.

(56) References Cited

U.S. PATENT DOCUMENTS

| 8,377,762 B2 * | 2/2013 | Eguchi .................. H01L 27/12 438/155 |
| 8,698,189 B2 | 4/2014 | Park et al. |
| 8,933,451 B2 | 1/2015 | Kim et al. |
| 9,287,342 B2 | 3/2016 | Kwon et al. |

(Continued)

FOREIGN PATENT DOCUMENTS

| JP | 2013-174692 | 9/2013 |
| KR | 1020080031091 | 4/2008 |

(Continued)

OTHER PUBLICATIONS

Office Action issued in corresponding U.S. Appl. No. 15/948,214.

(Continued)

*Primary Examiner* — Joseph Schoenholtz
(74) *Attorney, Agent, or Firm* — F. Chau & Associates, LLC

(57) ABSTRACT

A display device includes: a substrate including a bending area located between a first region and a second region; an organic layer disposed over the substrate, an upper surface of the organic layer including an uneven surface in the bending area, the uneven surface including a plurality of protrusions; and a conductive layer extending from the first region to the second region across the bending area, the conductive layer being located over the organic layer and including a plurality of through holes.

28 Claims, 11 Drawing Sheets

(56) References Cited

U.S. PATENT DOCUMENTS

| | | | |
|---|---|---|---|
| 9,543,370 B2* | 1/2017 | Tsai | H01L 27/3276 |
| 9,659,966 B2* | 5/2017 | Kwak | H01L 27/1218 |
| 9,698,162 B2* | 7/2017 | Jeong | H01L 27/3246 |
| 9,882,152 B2* | 1/2018 | Namkung | H01L 51/0097 |
| 10,020,462 B1 | 7/2018 | Ai et al. | |
| 2006/0169989 A1* | 8/2006 | Bhattacharya | H01L 51/0021 257/79 |
| 2008/0079889 A1 | 4/2008 | Lee et al. | |
| 2011/0227846 A1 | 9/2011 | Imazeki | |
| 2012/0162099 A1 | 6/2012 | Yoo et al. | |
| 2013/0148312 A1 | 6/2013 | Han et al. | |
| 2014/0097408 A1 | 4/2014 | Kim et al. | |
| 2014/0217373 A1* | 8/2014 | Youn | H01L 23/4985 257/40 |
| 2014/0217397 A1* | 8/2014 | Kwak | H01L 27/1218 257/43 |
| 2014/0232956 A1 | 8/2014 | Kwon et al. | |
| 2014/0353670 A1* | 12/2014 | Youn | H01L 27/124 257/72 |
| 2015/0102298 A1* | 4/2015 | Namkung | H01L 51/0097 257/40 |
| 2015/0116959 A1 | 4/2015 | Namkung | |
| 2015/0179728 A1 | 6/2015 | Kwon et al. | |
| 2016/0014883 A1 | 1/2016 | Cho et al. | |
| 2016/0195901 A1 | 7/2016 | Kauhaniemi et al. | |
| 2016/0204185 A1 | 7/2016 | Iijima et al. | |
| 2016/0218305 A1* | 7/2016 | Kim | G02F 1/133305 |
| 2016/0239133 A1* | 8/2016 | Ko | G06F 1/1643 |
| 2016/0336523 A1* | 11/2016 | Kwon | H01L 27/3276 |
| 2017/0062532 A1* | 3/2017 | Jeong | H01L 27/3246 |
| 2017/0092230 A1* | 3/2017 | Kuwabara | G06F 3/1423 |
| 2017/0147117 A1* | 5/2017 | Song | G06F 3/0412 |
| 2017/0237025 A1* | 8/2017 | Choi | H01L 51/0097 257/40 |
| 2017/0329368 A1* | 11/2017 | Rho | G06F 1/1652 |
| 2018/0019418 A1* | 1/2018 | Sonoda | H01L 51/0097 |

FOREIGN PATENT DOCUMENTS

| | | |
|---|---|---|
| KR | 1020120044019 | 5/2012 |
| KR | 1020130007053 | 1/2013 |
| KR | 1020140045193 | 4/2014 |
| KR | 1020140103025 | 8/2014 |
| KR | 1020140108914 | 9/2014 |
| KR | 1020150043970 | 4/2015 |
| KR | 1020150049303 | 5/2015 |
| KR | 1020150061769 | 6/2015 |
| KR | 1020150074808 | 7/2015 |

OTHER PUBLICATIONS

Office Action dated Sep. 27, 2018 issued in corresponding U.S. Appl. No. 15/404,057.
Notice of Allowance dated Nov. 23, 2018 issued in corresponding U.S. Appl. No. 15/948,214.

* cited by examiner

DISPLAY DEVICE INCLUDING AN ORGANIC LAYER HAVING AN UNEVEN SURFACE WITH A PLURALITY OF PROTRUSIONS IN A BENDING AREA

CROSS-REFERENCE TO RELATED APPLICATION

This application claims priority under 35 U.S.C. § 119 to Korean Patent Application No. 10-2016-0032074, filed on Mar. 17, 2016, in the Korean Intellectual Property Office, the disclosure of which is incorporated by reference herein in its entirety.

TECHNICAL FIELD

An exemplary embodiment of the inventive concept relates to a display device.

DESCRIPTION OF THE RELATED ART

A display device is an output device for presentation of information in visual form. Generally, a display device includes a display portion located over a substrate. By bending a portion of the display device, the visibility of the display device at various angles may be increased and the area of a non-display area of the display device may be reduced.

However, a defect may occur during a process of manufacturing a bent display device such that the life of the display device is reduced.

SUMMARY

According to an exemplary embodiment of the inventive concept, a display device includes: a substrate including a bending area located between a first region and a second region and bent around a bending axis in the bending area; an organic layer disposed over the substrate, an upper surface of the organic layer including an uneven surface in the bending area, the uneven surface including a plurality of protrusions; and a conductive layer extending from the first region to the second region across the bending area, the conductive layer being located over the organic layer and including a plurality of through holes, locations of the plurality of through holes being synchronized to locations of the plurality of protrusions.

The display device may further include: an inorganic insulating layer disposed over the substrate and including an opening or a groove in the bending area, wherein the organic layer is disposed in a portion of the opening or the groove.

Locations of the plurality of through holes may correspond to locations of the plurality of protrusions.

Locations of the plurality of through holes may correspond to locations of a plurality of concave portions between the plurality of protrusions.

The plurality of through holes may be arranged in a line in an extension direction of the conductive layer.

A first edge of the conductive layer located on a first side of an extension central axis of the conductive layer may comprise first concave portions corresponding to spaces between the plurality of through holes, and a second edge of the conductive layer located on a second side of the extension central axis of the conductive layer may comprise second concave portions corresponding to the spaces between the plurality of through holes.

The first concave portions may correspond one-to-one with the second concave portions.

The plurality of through holes may be arranged in an extension direction of the conductive layer and comprise a plurality of first through holes and a plurality of second through holes, respective centers of the plurality of first through holes may be located on a first side of an extension central axis of the conductive layer, and respective centers of the plurality of second through holes may be located on a second side of the extension central axis.

The plurality of first through holes and the plurality of second through holes may be alternately disposed in the extension direction.

A first edge of the conductive layer located on the second side of the extension central axis may comprise first concave portions corresponding to the plurality of second through holes, and a second edge of the conductive layer located on the first side of the extension central axis may comprise second concave portions corresponding to the plurality of first through holes.

The plurality of through holes may be arranged in an extension direction of the conductive layer and a lateral direction crossing the extension direction.

A number of the plurality of through holes arranged in the lateral direction may be changed in the extension direction.

N through holes in the lateral direction and m through holes in the lateral direction are alternately arranged in the extension direction.

According to an exemplary embodiment of the inventive concept, a display device includes: a substrate including a bending area located between a first region and a second region and bent around a bending axis in the bending area; an organic layer disposed over the substrate and including a plurality of islands spaced apart from each other and disposed in the bending area; and a conductive layer extending from the first region to the second region across the bending area, the conductive layer being located over the organic layer and including a plurality of through holes, locations of the plurality of through holes being synchronized to locations of the plurality of islands.

The display device may further include: an inorganic insulating layer disposed over the substrate and including an opening or a groove in the bending area, the organic layer disposed in a portion of the opening or the groove.

Each of the plurality of islands may extend in a bending axis direction and the plurality of islands may be spaced apart from each other in a direction crossing the bending axis direction.

Locations of the plurality of through holes may correspond to locations of the plurality of islands.

Locations of the plurality of through holes may correspond to locations of spaces between the plurality of islands.

The plurality of through holes may be arranged in a line in an extension direction of the conductive layer.

A first edge of the conductive layer located on a first side of an extension central axis of the conductive layer may include first concave portions corresponding to spaces between the plurality of through holes, and a second edge of the conductive layer located on a second side of the extension central axis of the conductive layer may include second concave portions corresponding to the spaces between the plurality of through holes.

The first concave portions may correspond one-to-one with the second concave portions.

The plurality of through holes are arranged in an extension direction of the conductive layer and comprise a plurality of first through holes and a plurality of second through holes, respective centers of the plurality of first through holes are located on a first side of an extension central axis of the conductive layer, and respective centers of the plurality of second through holes are located on a second side of the extension central axis.

The plurality of first through holes and the plurality of second through holes may be alternately disposed in the extension direction.

A first edge of the conductive layer located on the second side of the extension central axis may include first concave portions corresponding to the plurality of second through holes, and a second edge of the conductive layer located on the first side of the extension central axis may include second concave portions corresponding to the plurality of first through holes.

The plurality of through holes may be arranged in an extension direction of the conductive layer and a lateral direction crossing the extension direction.

A number of the plurality of through holes arranged in the lateral direction may change depending on the extension direction.

N through holes in the lateral direction and m through holes in the lateral direction may be alternately arranged in the extension direction.

BRIEF DESCRIPTION OF THE DRAWINGS

The above and/or other features of the inventive concept will become more apparent by describing in detail exemplary embodiments thereof, with reference to the accompanying drawings in which.

DETAILED DESCRIPTION OF THE EMBODIMENTS

Figure 1:
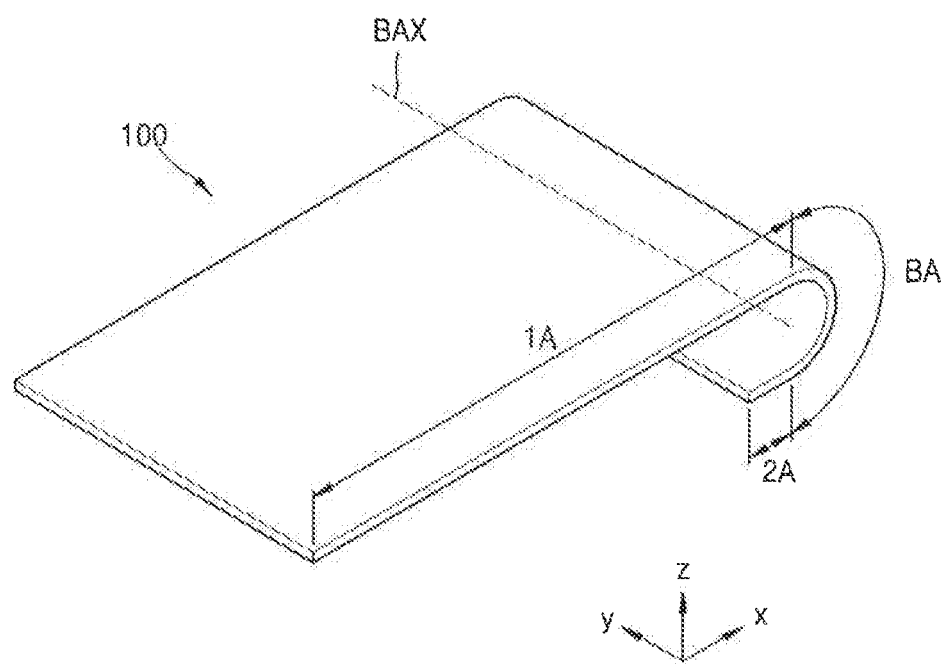
FIG. 1 is a perspective view illustrating a portion of a display device according to an exemplary embodiment of the inventive concept.

Exemplary embodiments of the inventive concept will now be described with reference to the drawings. This inventive concept may, however, be embodied in many different forms and should not be construed as limited to the exemplary embodiments set forth herein.

When description is made with reference to the drawings, like reference numerals in the drawings may denote like or corresponding elements, and repeated descriptions thereof may be omitted.

It will be understood that when a component, such as a layer, a film, a region, or a plate, is referred to as being "over" another component, the component can be directly on the other component or intervening components may be present thereon. In addition, sizes of components in the drawings may be exaggerated for convenience of explanation.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Figure 2:
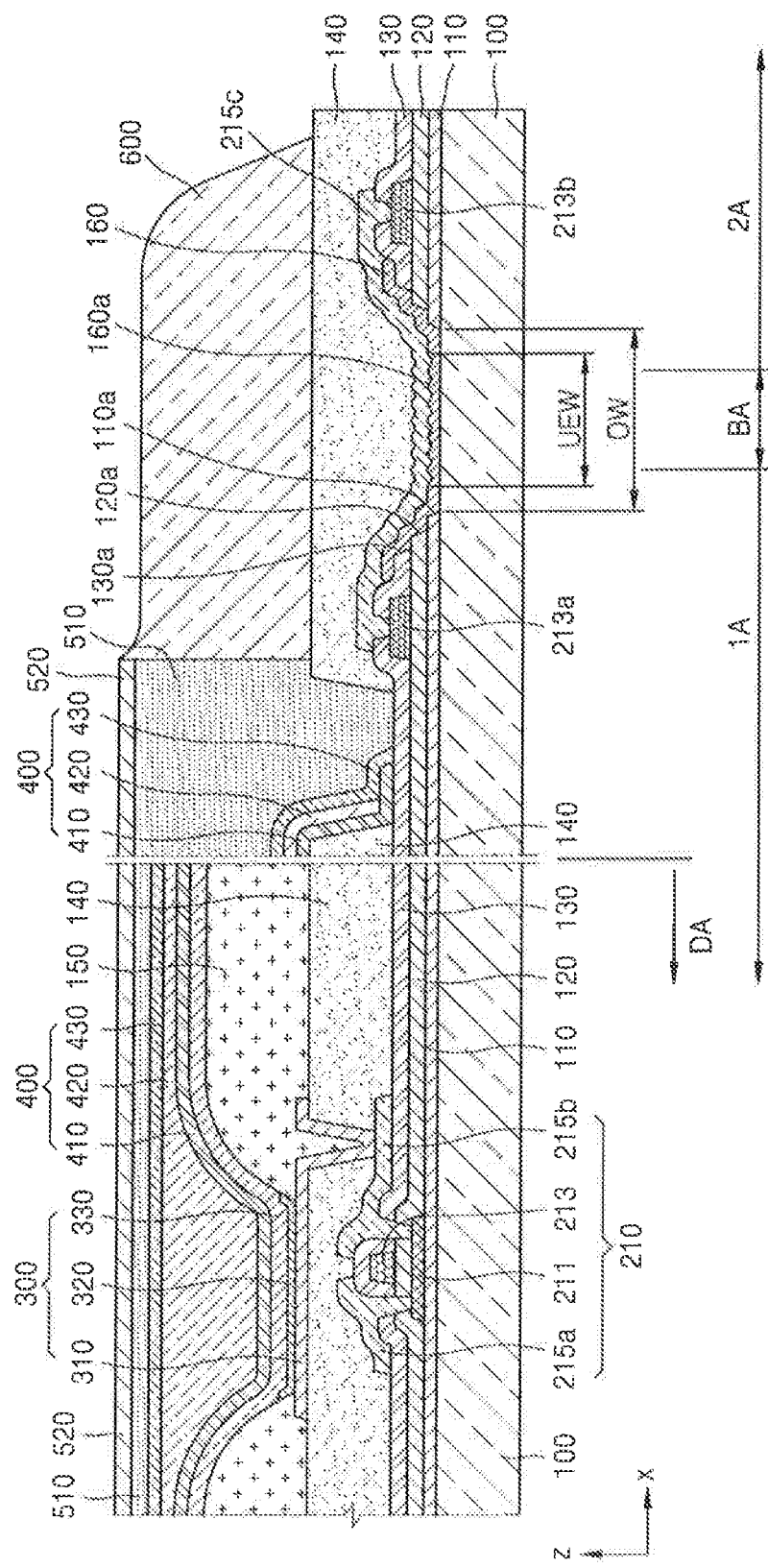
FIG. 2 is a cross-sectional view illustrating a portion of the display device of FIG. 1 according to an exemplary embodiment of the inventive concept.

FIG. 1 is a perspective view illustrating a portion of a display device according to an exemplary embodiment of the inventive concept, and FIG. 2 is a cross-sectional view illustrating a portion of the display device of FIG. 1 according to an exemplary embodiment of the inventive concept.

As illustrated in FIG. 1, in the display device according to an exemplary embodiment of the inventive concept, a portion of a substrate 100, which is a portion of the display device, is bent and thus the display device has a shape partially bent like the substrate 100. Hereinafter, for convenience of illustration, cross-sectional views or plan views of the embodiments will illustrate that the display device is not bent even though it actually is.

As illustrated in FIGS. 1 and 2, the substrate 100 of the display device according to an exemplary embodiment of the inventive concept has a bending area BA extending in a first direction (+y direction). The bending area BA is located between a first region 1A and a second region 2A in a second direction (+x direction) crossing the first direction. In addition, as illustrated in FIG. 1, the substrate 100 is bent around a bending axis BAX extending in the first direction (+y direction). The substrate 100 may include various materials having a flexible or bendable characteristic. For example, the substrate 100 may include a polymer resin such as polyethersulphone (PES), polyacrylate (PAR), polyetherimide (PEI), polyethylene naphthalate (PEN), polyethyleneterephthalate (PET), polyphenylene sulfide (PPS), polyarylate, polyimide (PI), polycarbonate (PC), or cellulose acetate propionate (CAP).

The first region 1A includes a display area DA. The first region 1A may include a portion of a non-display area outside the display area DA in addition to the display area DA as illustrated in FIG. 2. The display area DA may extend to the bending area BA. In addition, the second region 2A may include the non-display area.

As illustrated in FIG. 2, not only a display element 300 but also a thin film transistor (TFT) 210 electrically connected to the display element 300 may be located in the display area DA of the substrate 100. FIG. 2 illustrates that an organic light-emitting diode (OLED) as the display element 300 is located in the display area DA. A configuration in which the OLED is electrically connected to the TFT 210 may be understood as a configuration in which a pixel electrode 310 is electrically connected to the TFT 210. A TFT may be disposed also in a circumferential region outside the display area DA of the substrate 100. The TFT located in the circumferential region may be a portion of a circuit portion for controlling an electric signal applied to the display area DA, for example.

The TFT 210 may include a semiconductor layer 211, a gate electrode 213, a source electrode 215a, and a drain electrode 215b including amorphous silicon, polycrystalline silicon, or an organic semiconductor material. To secure insulation from the semiconductor layer 211 and the gate electrode 213, a gate insulating layer 120 including an inorganic material such as silicon oxide, silicon nitride, and/or silicon oxynitride may be disposed between the semiconductor layer 211 and the gate electrode 213. In addition, an interlayer insulating layer 130 including an inorganic material such as silicon oxide, silicon nitride, and/or silicon oxynitride may be disposed over the gate electrode 213. The source electrode 215a and the drain electrode 215b may be disposed over the interlayer insulating layer 130. The insulating layer 120 or 130 including an inorganic material may be formed by using chemical vapor deposition (CVD) or atomic layer deposition (ALD). The same may be applied to embodiments described below and variants thereof.

A buffer layer 110 including an inorganic material such as silicon oxide, silicon nitride, and/or silicon oxynitride may be disposed between the TFT 210 and the substrate 100. The buffer layer 110 may increase a planarization characteristic of the upper surface of the substrate 100, or prevent or minimize impurities of the substrate 100, etc. from penetrating into the semiconductor layer 211 of the TFT 210.

In addition, a planarization layer 140 may be disposed over the TFT 210. For example, as illustrated in FIG. 2, in the case where an OLED is disposed over the TFT 210, the planarization layer 140 may planarize the upper portion of a protective layer covering the TFT 210. The planarization layer 140 may include an organic material such as acryl, benzocyclobutene (BCB), or hexamethyldisiloxane (HMDSO). Although FIG. 2 illustrates the planarization layer 140 is a single layer, the planarization layer 140 may be a multi-layer and may be changed variously. In addition, as illustrated in FIG. 2, the planarization layer 140 includes an opening outside the display area DA to allow a portion of the planarization layer 140 in the display area DA to be physically separated from a portion of the planarization layer 140 in the second region 2A. This is done to prevent external impurities from reaching the inside of the display area DA via the inside of the planarization layer 140.

In the display area DA of the substrate 100, an OLED including the pixel electrode 310, an opposite electrode 330, and an intermediate layer 320 disposed between the pixel electrode 310 and the opposite electrode 330 and including an emission layer may be located over the planarization layer 140. The pixel electrode 310 is electrically connected to the TFT 210 by contacting one of the source electrode 215a and the drain electrode 215b via an opening formed in the planarization layer 140 as illustrated in FIG. 2.

A pixel-defining layer 150 may be disposed over the planarization layer 140. The pixel-defining layer 150 defines a pixel by including an opening corresponding to sub-pixels, in other words, an opening exposing at least the central portion of the pixel electrode 310. In addition, in a case illustrated in FIG. 2, the pixel-defining layer 150 prevents an arc, etc. from occurring at the edge of the pixel electrode 310 by increasing a distance between the edge of the pixel electrode 310 and the opposite electrode 330 over the pixel electrode 310. The pixel-defining layer 150 may include an organic material such as polyimide (PI) or hexamethyldisiloxane (HMDSO).

The intermediate layer 320 of the OLED may include a low molecular material or a polymer material. In the case where the intermediate layer 320 includes a low molecular material, the intermediate layer 320 may have a structure in which a hole injection layer (HIL), a hole transport layer (HTL), an emission layer (EML), an electron transport layer (ETL), an electron injection layer (EIL), etc. are stacked in a single or composite structure. The intermediate layer 320 may include various organic materials such as copper phthalocyanine (CuPc), N,N'-Di(naphthalene-1-yl)-N,N'-diphenyl-benzidine (NPB), and tris-8-hydroxyquinoline aluminum (Alq3). These layers may be formed by using a vacuum deposition method.

In the case where the intermediate layer 320 includes a polymer material, the intermediate layer 320 may have a structure including an HTL and an EML. In this case, the HTL may include a PEDOT, and the EML may include a polymer material such as a poly-phenylenevinylene (PPV)-based material and a polyfluorene-based material. The intermediate layer 320 may be formed by using screen printing, an inkjet printing method, or laser induced thermal imaging (LITI), etc.

It is to be understood, however, that the intermediate layer 320 is not necessarily limited thereto and may have various structures. In addition, the intermediate layer 320 may include a layer integrally formed over a plurality of pixel electrodes 310 and include a layer patterned to correspond to the plurality of pixel electrodes 310.

The opposite electrode 330 is disposed over the display area DA and may cover the display area DA as illustrated in FIG. 2. In other words, the opposite electrode 330 may be integrally formed over a plurality of OLEDs and may correspond to the plurality of pixel electrodes 310.

Since the OLED may be damaged by external moisture or oxygen, etc., an encapsulation layer 400 may protect the OLEDs by covering the OLEDs. The encapsulation layer 400 may cover the display area DA and extend to the outer side of the display area DA. As illustrated in FIG. 2, the encapsulation layer 400 may include a first inorganic encapsulation layer 410, an organic encapsulation layer 420, and a second inorganic encapsulation layer 430.

The first inorganic encapsulation layer 410 may cover the opposite electrode 330 and include silicon oxide, silicon nitride, and/or silicon oxynitride. Other layers such as a capping layer, etc. may be disposed between the first inorganic encapsulation layer 410 and the opposite electrode 330. Since the first inorganic encapsulation layer 410 is formed along a structure therebelow, the upper surface of the first inorganic encapsulation layer 410 is not planarized as illustrated in FIG. 2. The organic encapsulation layer 420 may cover the first inorganic encapsulation layer 410. Unlike the first inorganic encapsulation layer 410, the upper surface of the organic encapsulation layer 420 may be planarized. For example, the upper surface of the organic encapsulation layer 420 may be approximately planarized in a portion corresponding to the display area DA. The organic encapsulation layer 420 may include at least one of polyethyleneterephthalate (PET), polyethylene naphthalate (PEN), polycarbonate (PC), polyimide (PI), polyethylenesulphonate, polyoxymethylene (POM), polyacrylate (PAR), and hexamethyldisiloxane. The second inorganic encapsulation layer 430 may cover the organic encapsulation layer 420 and include silicon oxide, silicon nitride, and/or silicon oxynitride. The second inorganic encapsulation layer 430 may allow the organic encapsulation layer 420 not to be exposed to the outside by contacting the first inorganic encapsulation layer 410 at the edge thereof located outside the display area DA.

Since the encapsulation layer 400 includes the first inorganic encapsulation layer 410, the organic encapsulation layer 420, and the second inorganic encapsulation layer 430, even when a crack occurs inside the encapsulation layer 400, the crack may not be connected between the first inorganic encapsulation layer 410 and the organic encapsulation layer 420 or between the organic encapsulation layer 420 and the second inorganic encapsulation layer 430. This way, a path through which external moisture or oxygen, etc. penetrates into the display area DA may be prevented or minimized from being formed.

A process of forming a touch electrode of various patterns for a touchscreen function, or a touch protective layer for protecting the touch electrode over the encapsulation layer 400 may be further performed. The touch electrode or the touch protective layer may be formed over the encapsulation layer 400 by using a process such as deposition. The display device may have a touchscreen function by attaching a touch panel having a touch electrode, etc. over the encapsulation layer 400. It is to be understood that various touchscreen configurations may be made.

A polarization plate 520 may be located over the encapsulation layer 400 by using an optically clear adhesive (OCA) 510. The polarization plate 520 may reduce reflection of external light. For example, external light passes through the polarization plate 520, is reflected by the upper surface of the opposite electrode 330, and then, passes through the polarization plate 520 again. In this case, since the external light passes through the polarization plate 520 two times, the phase of the external light may change. As a result, destructive interference may occur by since the phase of the reflected light is different from the phase of the external light entering the polarization plate 520. However, visibility may be increased by reducing the external light reflection. The OCA 510 and the polarization plate 520 may cover an opening of the planarization layer 140 as illustrated in FIG. 2. The display device according to an exemplary embodiment of the inventive concept does not always have to include the polarization plate 520. Accordingly, the polarization plate 520 may be omitted and replaced with another element. For example, the display device may omit the polarization plate 520 and reduce the external light reflection by using a black matrix and a color filter.

In addition, the buffer layer 110, the gate insulating layer 120, and the interlayer insulating layer 130 including an inorganic material may be referred to as an inorganic insulating layer. The inorganic insulating layer includes an opening corresponding to the bending area BA as illustrated in FIG. 2. In other words, the buffer layer 110, the gate insulating layer 120, and the interlayer insulating layer 130 may respectively include openings 110a, 120a, and 130a corresponding to the bending area BA. Since the opening corresponds to the bending area BA, the opening may overlap the bending area BA. In this case, the area of the opening may be larger than the area of the bending area BA. For example, FIG. 2 illustrates that the width OW of the opening is greater than the width of the bending area BA. In this case, the area of the opening may correspond to the area of an opening having a smallest area from among the openings 110a, 120a, and 130a of the buffer layer 110, the gate insulating layer 120, and the interlayer insulating layer 130. FIG. 2 illustrates the area of the opening corresponds to the area of the opening 110a of the buffer layer 110.

For example, as illustrated in FIG. 2, the area of the opening 120a of the gate insulating layer 120 may be greater than the area of the opening 110a of the buffer layer 110. However, an exemplary embodiment of the inventive concept is not limited thereto and the inner lateral surface of the opening 110a of the buffer layer 110 may coincide with the inner lateral surface of the opening 120a of the gate insulating layer 120 (see FIG. 12).

The display device according to an exemplary embodiment of the inventive concept includes an organic layer 160 filling at least a portion of the opening of the inorganic insulating layer. FIG. 2 illustrates that the organic layer 160 completely fills the opening. In addition, the display device according to an exemplary embodiment of the inventive concept includes a conductive layer 215c. The conductive layer 215c extends from the first region 1A to the second region 2A by way of the bending area BA and is located over the organic layer 160. The conductive layer 215c may be located over the inorganic insulating layer such as the interlayer insulating layer 130 in a region where the organic layer 160 does not exist. The conductive layer 215c may include the same material as that of the source electrode 215a or the drain electrode 215b and may be formed simultaneously with the source electrode 215a or the drain electrode 215b. In the case where the touch electrode is formed over the encapsulation layer 400, the conductive layer 215c may include the same material as that of the touch electrode and may be formed simultaneously with the touch electrode.

The organic layer 160 may include an uneven surface 160a in at least a portion of an upper surface thereof (in +z direction). Since the organic layer 160 includes the uneven surface 160a, the upper surface and/or lower surface of the conductive layer 215c located over the organic layer 160 may have a shape corresponding to the uneven surface 160a of the organic layer 160.

As described above, although FIG. 2 illustrates, for convenience of description, that the display device is not bent, the display device is in fact bent in the bending area BA as illustrated in FIG. 1. For example, the display device is manufactured such that the substrate 100 is approximately planarized as illustrated in FIG. 2, and then, the display device is formed to have the approximate shape illustrated in FIG. 1 by bending the substrate 100, etc. in the bending area BA. In this case, during a process in which the substrate 100, etc. are bent in the bending area BA, a tensile stress may be applied to the conductive layer 215c. However, the display device according to an exemplary embodiment of the inventive concept may prevent or minimize the occurrence of a defect in the conductive layer 215c during the bending process.

For example, if the inorganic insulating layer such as the buffer layer 110, the gate insulating layer 120 and/or interlayer insulating layer 130 does not have an opening in the bending area BA and has a continuous shape ranging from the first region 1A to the second region 2A and the conductive layer 215c is located over the inorganic insulating layer, a large tensile force is applied to the conductive layer 215c when the substrate 100, etc. are bent. Particularly, since the inorganic insulating layer has hardness higher than that of the organic layer, there is a high probability that a crack, etc. may occur in the inorganic insulating layer in the bending area BA. When a crack occurs in the inorganic insulating layer, a crack, etc. may also occur in the conductive layer 215c over the inorganic insulating layer, and thus, a probability that a defect such as a disconnection of the conductive layer 215c is high.

However, in the display device according to an exemplary embodiment of the inventive concept, the inorganic insulating layer has the opening in the bending area BA, and a portion of the conductive layer 215c that corresponds to the bending area BA is located over the organic layer 160 filling at least a portion of the opening of the inorganic insulating layer. Since the inorganic insulating layer has the opening in the bending area. BA, a probability that a crack may occur in the inorganic insulating layer is low, and further, since the organic layer 160 includes an organic material, a probability that a crack may occur is low. Therefore, the display device according to an exemplary embodiment of the inventive concept may prevent or minimize the occurrence of a crack, etc. in a portion of the conductive layer 215c corresponding to the bending area BA and located over the organic layer 160. In addition, since the organic layer 160 has a hardness less than that of the inorganic layer, the organic layer 160 may effectively minimize tensile stress concentrated at the conductive layer 215c by absorbing the tensile stress generated by the bending of the substrate 100, etc.

Furthermore, the display device according to an exemplary embodiment of the inventive concept may minimize the amount of tensile stress applied to the conductive layer 215c by allowing the upper surface and/or lower surface of the conductive layer 215c to have a shape corresponding to the uneven surface 160a of the organic layer 160. In other words, the display device according to an exemplary embodiment of the inventive concept may reduce a tensile stress that may occur during a bending process via deformation of the organic layer 160 having a low strength. In this case, the display device may effectively prevent a defect such as the disconnection of the conductive layer 215c by allowing the conductive layer 215c to be deformed in correspondence with the organic layer 160 during the bending.

In addition, the surface area of the upper surface of the organic layer 160 and the surface areas of the upper and lower surfaces of the conductive layer 215c inside the opening may increase by forming the uneven surface 160a in at least a portion of the upper surface (in +z direction) of the organic layer 160. Since the surface areas of the upper surface of the organic layer 160 and the upper and lower surfaces of the conductive layer 215c are wide a margin by which the organic layer 160 and the conductive layer 215c may be deformed (to reduce the tensile stress from bending the substrate 100) increases.

In addition, the conductive layer 215c may be effectively prevented from being damaged or a probability that the conductive layer 215c is damaged may be minimized by allowing the conductive layer 215c to include a plurality of through holes 215d (see FIG. 3) as will be described below. Since the conductive layer 215c includes a plurality of through holes 215d, the flexibility of the conductive layer 215c increases, and thus, even when a tensile stress occurs during a bending process, the occurrence of a defect such as disconnection of the conductive layer 215c may be effectively prevented. Although FIG. 2 does not illustrate the through holes 215d inside the conductive layer 215c, for convenience of description, FIG. 2 may be understood as illustrating only a portion of the conductive layer 215c in which the plurality of through holes 215d are not located.

The uneven surface 160a of the upper surface (in +z direction) of the organic layer 160 may be formed by using various methods. For example, a photoresist material is used when forming the organic layer 160. In this case, a specific portion may be etched (removed) relatively further than other portions by differing the amount of exposure applied to a plurality of portions of the organic layer 160 whose upper surface is approximately planarized via a slit mask or a half-tone mask during a manufacturing process. Here, the further etched portion may be a concave portion in the upper surface of the organic layer 160. The method used when manufacturing the display device according to an exemplary embodiment of the inventive concept is not limited to the just described method. For example, after the organic layer 160 whose upper surface is approximately planarized is formed, only a specific portion thereof may be removed by using dry etching, etc.

To allow the organic layer 160 to include the uneven surface 160a in the upper surface thereof (in +z direction), the organic layer 160 may include a plurality of grooves extending in the first direction (+y direction) in the upper surface thereof (in +z direction). In this case, the shape of the upper surface of the conductive layer 215c over the organic layer 160 corresponds to the shape of the upper surface of the organic layer 160 (in other words, the uneven surface 160a).

The organic layer 160 may include the uneven surface 160a inside only the opening of the inorganic insulating layer. FIG. 2 illustrates that the width UEW of a portion including the uneven surface 160a of the organic layer 160 is narrower than the width OW of the opening of the inorganic insulating layer.

If the organic layer 160 includes the uneven surface 160a inside and outside the opening of the inorganic insulating layer, it is understood that the organic layer 160 includes the uneven surface 160a in the neighborhood of the inner surface of the opening 110a of the buffer layer 110, the inner surface of the opening 120a of the gate insulating layer 120, or the inner surface of the opening 130a of the interlayer insulating layer 130. Since a portion of the organic layer 160 corresponding to the concave portion of the uneven surface 160a has a relatively thin thickness compared to the thickness of a portion of the organic layer 160 that protrudes from the base of the opening of the inorganic insulating layer, if the concave portion is located in the inner surface of the opening 110a of the buffer layer 110, the inner surface of the opening 120a of the gate insulating layer 120, or the inner surface of the opening 130a of the interlayer insulating layer 130, the organic layer 160 may not be continuously connected and disconnected. Therefore, it is possible to prevent the organic layer 160 from being disconnected in the neighborhood of the inner surface of the opening 110a of the buffer layer 110, the inner surface of the opening 120a of the gate insulating layer 120, or the inner surface of the opening 130a of the interlayer insulating layer 130 by providing the organic layer 160 with the uneven surface 160a only inside the opening of the inorganic insulating layer.

As described above, to prevent disconnection, etc. of the conductive layer 215c from occurring in the bending area BA, the organic layer 160 may include the uneven surface 160a in the bending area BA. Therefore, the area of a portion including the uneven surface 160a of the organic layer 160 may be wider than the area of the bending area BA but narrower than the area of the opening. This is illustrated in FIG. 2 in which the width UEW of the portion including the uneven surface 160a of the organic layer 160 is wider than the width of the bending area BA and narrower than the width OW of the opening.

The display device according to an exemplary embodiment of the inventive concept may further include additional conductive layers 213a and 213b in addition to the conductive layer 215c. The additional conductive layers 213a and 213b may be disposed in the first area 1A or the second area 2A such that the additional conductive layers 213a and 213b are located in a layer different from the layer in which the conductive layer 215c is located. The additional conductive layers 213a and 213b may be electrically connected to the conductive layer 215c. FIG. 2 illustrates that the additional conductive layers 213a and 213b include the same material as that of the gate electrode 213 of the TFT 210 and are located in the same layer in which the gate electrode 213 is disposed, in other words, over the gate insulating layer 120. In addition, FIG. 2 illustrates that the conductive layer 215c contacts the additional conductive layers 213a and 213b via contact holes formed in the interlayer insulating layer 130. In addition, FIG. 2 illustrates that the additional conductive layer 213a is located in the first region 1A, and the additional conductive layer 213b is located in the second region 2A.

The additional conductive layer 213a located in the first region 1A may be electrically connected to the TFT, etc. inside the display area DA, and thus, the conductive layer 215c may be electrically connected to the TFT, etc. inside the display area DA via the additional conductive layer 213a. The additional conductive layer 213b located in the second region 2A may be also electrically connected to the TFT, etc. inside the display area DA via the conductive layer 215c. As described above, the additional conductive layers 213a and 213b may be electrically connected to elements located inside the display area DA even though they are located outside the display area DA, and may extend toward the display area DA and at least a portion thereof may be located inside the display area DA while they are located outside the display area DA.

As described above, although FIG. 2 illustrates that the display device is not bent, for convenience of description, the display device according to an exemplary embodiment of the inventive concept includes the substrate 100, etc. that are actually bent in the bending area BA as illustrated in FIG. 1. To accomplish this, the display device is manufactured such that the substrate 100 is approximately planarized during a manufacturing process as illustrated in FIG. 2, and then, the display device is given the shape illustrated in FIG. 1 by bending the substrate 100, etc. in the bending area BA. In this case, while the substrate 100, etc. are bent in the bending area BA, a tensile stress may be applied to elements located inside the bending area BA.

Therefore, the occurrence of a defect such as a crack in the conductive layer 215c or a disconnection of the conductive layer 215c may be prevented by providing the conductive layer 215c crossing the bending area BA with a material having a high elongation. In addition, the efficiency of electric signal transfer may increase in the display device or a defect occurrence ratio during the manufacturing process thereof may reduce by forming the additional conductive layers 213a and 213b by using a material having an elongation lower than that of the conductive layer 215c but having electrical/physical characteristics different from those of the conductive layer 215c in the first region 1A or the second region 2A. For example, the additional conductive layers 213a and 213b may include Mo, and the conductive layer 215c may include Al. The conductive layer 215c or the additional conductive layers 213a and 213b may have a multi-layered structure.

Unlike FIG. 2, the additional conductive layer 213b located in the second region 2A may be electrically connected to various electronic devices or a printed circuit board, etc. by not covering at least a portion of the upper surface thereof with the planarization layer 140, etc., but rather exposing it to the outside.

In addition, as illustrated in FIG. 2, the organic layer 160 may cover the inner surface of the opening of the inorganic insulating layer. As described above, the conductive layer 215c may include the same material as that of the source electrode 215a and the drain electrode 215b and may be formed simultaneously with the source electrode 215a and the drain electrode 215b. For example, after a conductive layer is formed over the entire surface of the substrate 100, the source electrode 215a, the drain electrode 215b, and the conductive layer 215c may be formed by patterning the conductive layer. If the organic layer 160 does not cover the inner surface of the opening 110a of the buffer layer 110, the inner surface of the opening 120a of the gate insulating layer 120, or the inner surface of the opening 130a of the interlayer insulating layer 130, conductive materials may not be removed but remain on the inner surface of the opening 110a of the buffer layer 110, the inner surface of the opening 120a of the gate insulating layer 120, or the inner surface of the opening 130a of the interlayer insulating layer 130 while the conductive layer is patterned. In this case, the remaining conductive materials may cause a short circuit between the other conductive layers.

Therefore, while the organic layer 160 is formed, the organic layer 160 may cover the inner lateral surface of the opening of the inorganic insulating layer. For reference, although FIG. 2 illustrates that the organic layer 160 has a uniform thickness, the organic layer 160 may have different thicknesses depending on its location. For example, the slope of the upper surface of the organic layer 160 may be slight in the neighborhood of the inner surface of the opening 110a of the buffer layer 110, the inner surface of the opening 120a of the gate insulating layer 120, or the inner surface of the opening 130a of the interlayer insulating layer 130. Therefore, a conductive material that might need to be removed may already be removed during a process of patterning the conductive layer to form the source electrode 215a, the drain electrode 215b, and the conductive layer 215c.

In addition, a stress neutralization layer (SNL) 600 may be located outside the display area DA. In other words, the SNL 600 may be located over a portion of the conductive layer 215c that corresponds to at least the bending area BA.

When a certain stacked body is bent, a stress neutral plane exists inside the stacked body. If the SNL 600 does not exist, when the substrate 100, etc. are bent, an excessive tensile stress, etc. may be applied on the conductive layer 215c inside the bending area BA. This is because the location of the conductive layer 215c may not correspond to a stress neutral plane. However, the location of a stress neutral plane may be adjusted in a stacked body including all of the substrate 100, the conductive layer 215c, the SNL 600, etc. by providing the SNL 600 and adjusting the thickness, the modulus, etc. of the SNL 600. Therefore, tensile stress applied on the conductive layer 215c may be minimized by allowing the stress neutral plane to be located in the neighborhood of the conductive layer 215c via the SNL 600.

Unlike that shown in FIG. 2, the SNL 600 may extend to the edge of the substrate 100 of the display device. For example, at least a portion of the conductive layer 215c, the additional conductive layer 213b, and/or other conductive layers, etc. electrically connected to these layers may not be covered with the interlayer insulating layer 130 or the planarization layer 140, etc. and may be electrically connected to various electronic devices or a printed circuit board, etc. Accordingly, portions or structures exist to connect the conductive layer 215c, the additional conductive layer 213b, and/or other conductive layers electrically connected to these layers (215c and 213b) to the various electronic devices or the printed circuit board, etc. In this case, the electrically connected portion may be protected from impurities such as external moisture, and the SNL 600 may cover the electrically connected portion and thus also function as a protective layer. For this purpose, the SNL 600 may extend, for example, to the edge of the substrate 100 of the display device.

In addition, although FIG. 2 illustrates that the upper surface of the SNL 600 in a display area direction (−x direction) coincides with the upper surface (+z direction) of the polarization plate 520, an exemplary embodiment of the inventive concept is not limited thereto. For example, the end of the SNL 600 in the display area direction (−x direction) may cover a portion of the edge upper surface of the polarization plate 520. Alternatively, the end of the SNL 600 in the display area direction (−x direction) may not contact the polarization plate 520 and/or the OCA 510. Particularly, in the latter case, during a process of forming the SNL 600 or after the SNL 600 is formed, a gas generated from the SNL 600 may be prevented from moving to the display area direction (−x direction) and deteriorating the display element 300 such as an OLED.

As illustrated in FIG. 2, if the upper surface of the SNL 600 in the display area direction (−x direction) coincides with the upper surface (+z direction) of the polarization plate 520, or the end of the SNL 600 in the display area direction (−x direction) covers a portion of the edge of the upper surface of the polarization layer 520, or the end of the SNL 600 in the display area direction (−x direction) contacts the OCA 510, the thickness of the portion of the SNL 600 in the display area direction (−x direction) may be greater than the thickness of the other portions of the SNL 600. Since a liquefied or paste type material is coated and cured when forming the SNL 600, the volume of the SNL 600 may reduce during the curing process. Thus, in the case where the portion of the SNL 600 in the display area direction (−x direction) contacts the polarization plate 520 and/or the OCA 510, since the location of the relevant portion of the SNL 600 is fixed, volume reduction occurs in the remaining portion of the SNL 600. Consequently, the thickness of the portion of the SNL 600 in the display area direction (−x direction) may be greater than the thickness of the other portions of the SNL 600.

Figure 3:
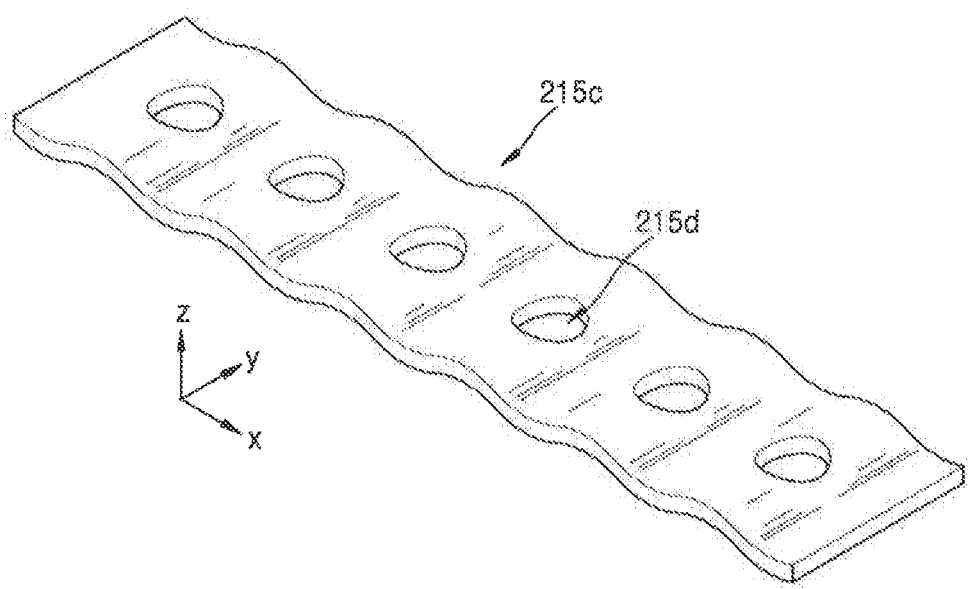
FIG. 3 is a perspective view illustrating a portion of the display device of FIG. 1 according to an exemplary embodiment of the inventive concept.

FIG. 3 is a perspective view illustrating a portion of the display device of FIG. 1, specifically a portion of the conductive layer 215c, according to an exemplary embodiment of the inventive concept. As illustrated in FIG. 3, the conductive layer 215c may include the plurality of through holes 215d. In this case, the locations of the plurality of through holes 215d of the conductive layer 215c may be synchronized with the locations of a plurality of protrusions of the uneven surface 160a of the organic layer 160. FIG. 3 illustrates that the locations of the plurality of through holes 215d of the conductive layer 215c correspond to the locations of the plurality of protrusions of the uneven surface 160a of the organic layer 160. For reference, although FIG. 3 does not illustrate the organic layer 160, it can be gleaned that the shape of the conductive layer 215c corresponds to the shape of the uneven surface 160a of the organic layer 160 as described above. Therefore, it may be understood that convex portions in the upper direction (+z direction) of the conductive layer 215c correspond to protrusions of the uneven surface 160a of the organic layer 160, and concave portions in the lower direction (−z direction) of the conductive layer 215c correspond to concave portions between the protrusions of the uneven surface 160a of the organic layer 160.

As mentioned above, the locations of the plurality of through holes 215d of the conductive layer 215c may be synchronized with the locations of the plurality of protrusions of the uneven surface 160a. For example, the locations of the plurality of through holes 215d of the conductive layer 215c may correspond to the locations of the plurality of protrusions of the uneven surface 160a. In this case, even when a tensile stress is applied to the conductive layer 215c while the substrate 100, etc. are bent in the bending area BA, the occurrence of a defect in the conductive layer 215c may be prevented or minimized during the bending process.

When the substrate 100 is bent in the bending area BA, a tensile stress is concentrated on a portion of the conductive layer 215c corresponding to the protrusions of the uneven surface 160a of the organic layer 160. However, the display device according to an exemplary embodiment of the inventive concept may effectively prevent or minimize generation of a crack in the conductive layer 215c or disconnection of the conductive layer 215c by making the locations of the plurality of through holes 215d of the conductive layer 215c correspond to the plurality of protrusions of the uneven surface 160a of the organic layer 160. This is because, for example, the through holes 215d of the conductive layer 215c have increased flexibility.

Figure 4:
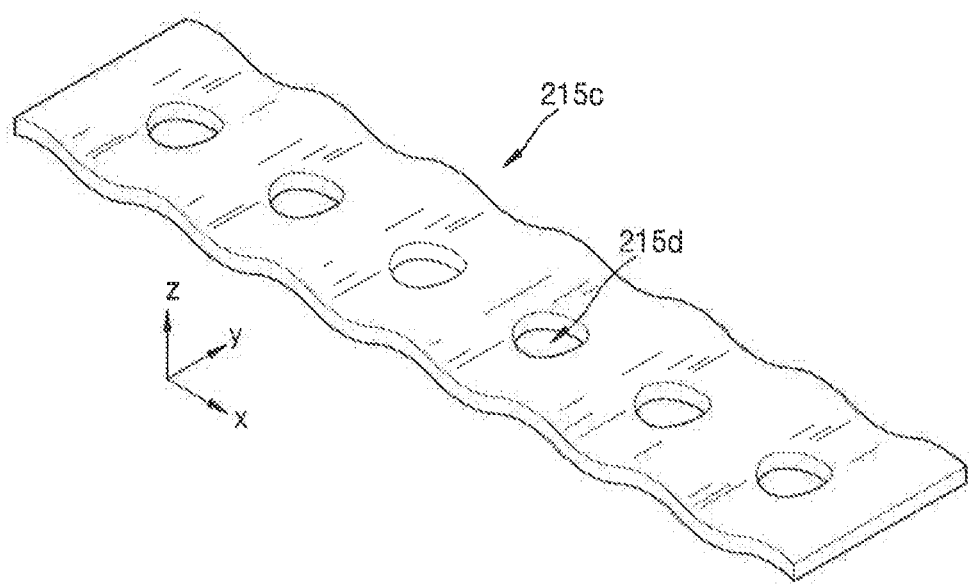
FIG. 4 is a perspective view illustrating a portion of a display device according to an exemplary embodiment of the inventive concept.

It is to be understood however, that an exemplary embodiment of the inventive concept is not limited thereto. As illustrated in FIG. 4, which is a perspective view illustrating a portion of a display device according to an exemplary embodiment of the inventive concept, the locations of the plurality of through holes 215d of the conductive layer 215c may correspond to a plurality of concave portions of the uneven surface 160a of the organic layer 160.

When the substrate 100 is bent in the bending area BA, stress is concentrated on portions of the conductive layer 215c corresponding to the concave portions of the uneven surface 160a of the organic layer 160. Particularly, stress in a direction away from the substrate 100 may be concentrated on those portions of the conductive layer 215c. However, the display device according to an exemplary embodiment of the inventive concept may effectively prevent or minimize the generation of a crack in the conductive layer 215c or the disconnection of the conductive layer 215c by having the locations of the plurality of through holes 215d of the conductive layer 215c correspond to the plurality of concave portions of the uneven surface 160a of the organic layer 160. This is because, for example, the through holes 215d of the conductive layer 215c have increased flexibility.

For example, an experiment showed that when the locations of the plurality of through holes 215d of the conductive layer 215c correspond to the plurality of protrusions of the uneven surface 160a of the organic layer 160, the magnitude of a tensile stress to be applied to the conductive layer 215c to disconnect the conductive layer 215c is greater, by about 77.1%, than the magnitude of a tensile stress to be applied to a conductive layer to disconnect the conductive layer not including the plurality of through holes 215d. In addition, an experiment showed that when the locations of the plurality of through holes 215d of the conductive layer 215c correspond to the plurality of concave portions of the uneven surface 160a of the organic layer 160, the magnitude of a tensile stress to be applied to the conductive layer 215c to disconnect the conductive layer 215c is greater, by about 77.2%, than the magnitude of a tensile stress to be applied to a conductive layer to disconnect the conductive layer not including the plurality of through holes 215d. Therefore, as described above, the generation of a crack in the conductive layer 215c or the disconnection of the conductive layer 215c may be effectively prevented or minimized by providing the locations of the plurality of through holes 215d of the conductive layer 215c to correspond to the plurality of protrusions or the plurality of concave portions of the uneven surface 160a of the organic layer 160.

Figure 5:
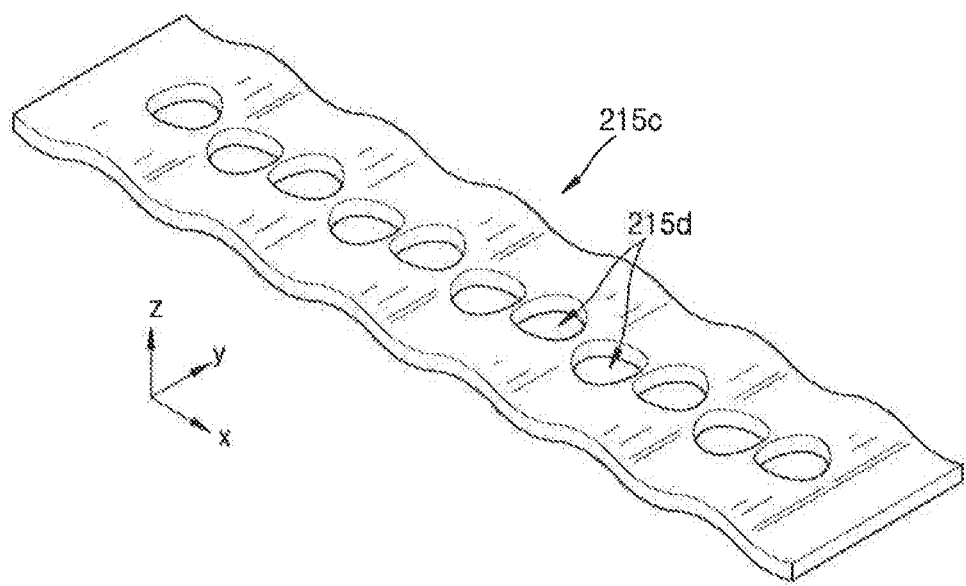
FIG. 5 is a perspective view illustrating a portion of a display device according to an exemplary embodiment of the inventive concept.

As illustrated in FIG. 5, which is a perspective view illustrating a portion of a display device according to an exemplary embodiment of the inventive concept, the locations of the plurality of through holes 215d of the conductive layer 215c may correspond to both the plurality of protrusions and the plurality of concave portions of the uneven surface 160a of the organic layer 160.

For example, an experiment showed that when the locations of the plurality of through holes 215d of the conductive layer 215c do not correspond to the plurality of protrusions or the plurality of concave portions but correspond to inclined portions between the uneven surface 160a of the organic layer 160, the magnitude of a tensile stress to be applied to the conductive layer 215c to disconnect the conductive layer 215c is greater, by about 69.9%, than the magnitude of a tensile stress to be applied to a conductive layer to disconnect the conductive layer not including the plurality of through holes 215d. Therefore, although this case also provides an effective technique of preventing crack generation or disconnection, configuring the locations of the plurality of through holes 215d of the conductive layer 215c to correspond to the plurality of protrusions or the plurality of concave portions of the uneven surface 160a of the organic layer 160 provides a much greater effect of preventing crack generation or disconnection.

Figure 6:
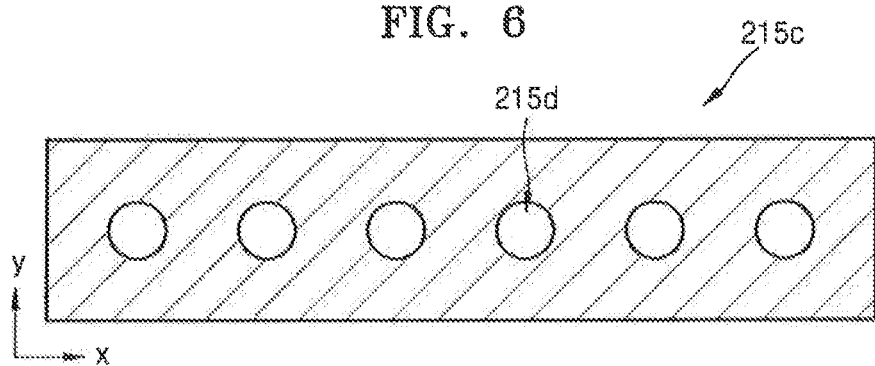
FIG. 6 is a plan view illustrating a portion of the display device of FIG. 5 according to an exemplary embodiment of the inventive concept.

FIG. 6 is a plan view illustrating a portion of the display device of FIG. 5 according to an exemplary embodiment of the inventive concept. As illustrated, the plurality of through holes 215d of the conductive layer 215c may be arranged in a line along an extension direction (+x direction) of the conductive layer 215c. However, the inventive concept is not limited thereto.

Figure 7:
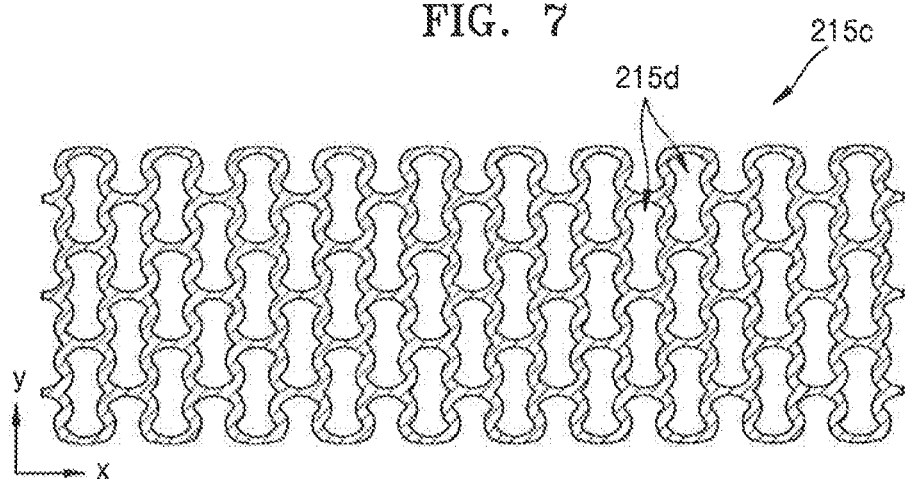
FIG. 7 is a plan view illustrating a portion of a display device according to an exemplary embodiment of the inventive concept.

For example, as illustrated in FIG. 7, which is a plan view illustrating a portion of a display device according to an exemplary embodiment of the inventive concept, the plurality of through holes 215d of the conductive layer 215c may be arranged in the extension direction (+x direction) and simultaneously also arranged in a lateral direction (+y direction) crossing the extension direction (+x direction). In this case, the number of plurality of through holes 215d arranged in the lateral direction (+y direction) may change along the extension direction (+x direction) of the conductive layer 215c. For example, n and m through holes 215d may be alternately arranged in the extension direction (+x direction) of the conductive layer 215c. FIG. 7 illustrates that two through holes 215d and three through holes 215d are alternately arranged.

Figure 8:
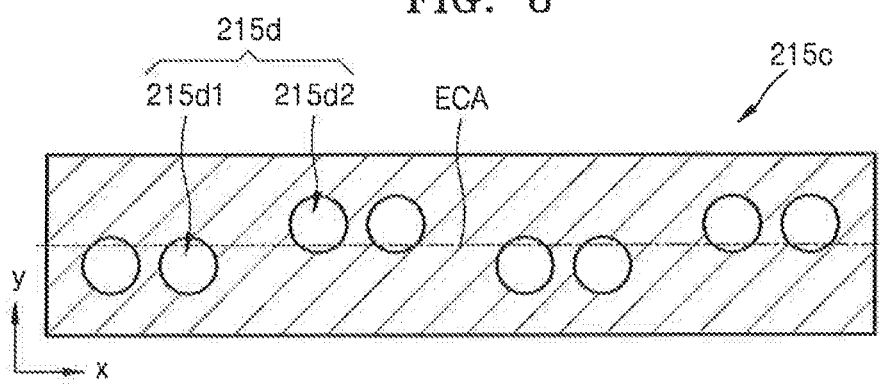
FIG. 8 is a plan view illustrating a portion of a display device according to an exemplary embodiment of the inventive concept.
Figure 9:
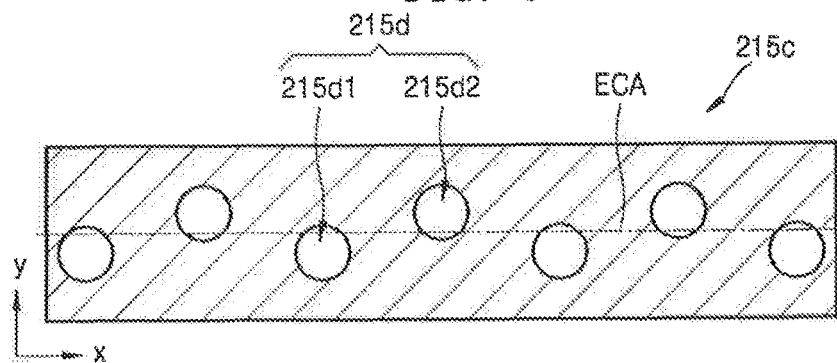
FIG. 9 is a plan view illustrating a portion of a display device according to an exemplary embodiment of the inventive concept.

As illustrated in FIG. 8, which is a plan view illustrating a portion of a display device according to an exemplary embodiment of the inventive concept, the plurality of through holes 215d of the conductive layer 215c may be arranged in the extension direction (+x direction) of the conductive layer 215c and may include a plurality of first through holes 215d1 each having a central axis located on one side (−y direction) of an extension central axis ECA, and a plurality of second through holes 215d2 each having a central axis located on the other side (+y direction) of the extension central axis ECA. In this case, as illustrated in FIG. 8, along the extension direction (+x direction) of the conductive layer 215c, two first through holes 215d1 may be adjacent to each other and then two second through holes 215d2 may be adjacent to each other. In addition, as illustrated in FIG. 9, which is a plan view illustrating a portion of a display device according to an exemplary embodiment of the inventive concept, a plurality of first through holes 215d1 and a plurality of second through holes 215d2 may be alternately located along the extension direction (+x direction) of the conductive layer 215c.

Figure 10:
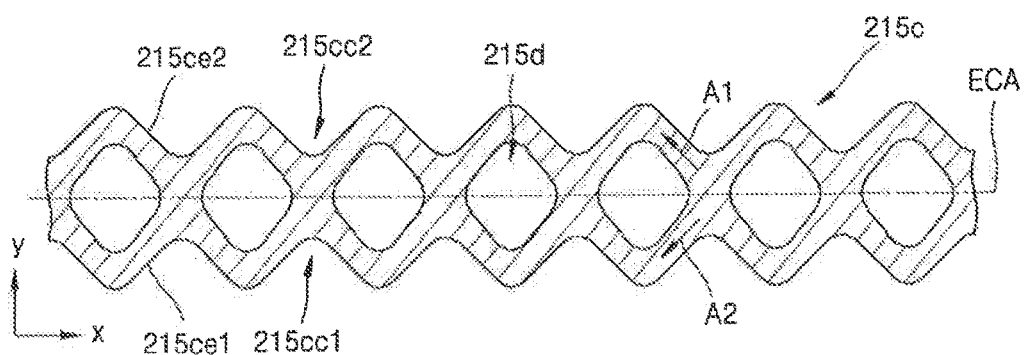
FIG. 10 is a plan view illustrating a portion of a display device according to an exemplary embodiment of the inventive concept.

FIG. 10 is a plan view illustrating the conductive layer 215c, which is a portion of a display device according to an exemplary embodiment of the inventive concept. In the display device of FIG. 10, a first edge 215ce1 of the conductive layer 215c located on one side (−y direction) of an extension central axis ECA of the conductive layer 215c has first concave portions 215cc1 corresponding to a space between the plurality of through holes 215d. In addition, a second edge 215ce2 of the conductive layer 215c located on the other side (+y direction) of the extension central axis ECA has second concave portions 215cc2 corresponding to a space between the plurality of through holes 215d. Particularly, the first concave portions 215cc1 may correspond one-to-one with the second concave portions 215cc2 as illustrated in FIG. 10.

In a case of the display device according to an exemplary embodiment of the inventive concept, an extension direction in the neighborhood of the through hole 215d of the conductive layer 215c forms a non-zero angle with respect to the whole extension direction (+x direction) of the conductive layer 215c as illustrated by arrows A1 and A2 in FIG. 10. When the substrate 100, etc. are bent in the bending area BA, a bending axis BAX (see FIG. 1) is approximately perpendicular to the extension central axis ECA of the conductive layer 215c. Therefore, a large tensile stress is applied to a portion of the conductive layer 215c extending in the extension central axis ECA of the conductive layer 215c, in other words, a portion of the conductive layer 215c extending in the whole extension direction (+x direction) of the conductive layer 215c. In the case of the display device according to an exemplary embodiment of the inventive concept, the extension directions in most local regions of the conductive layer 215c form a non-zero angle with respect to the whole extension direction (+x direction) of the conductive layer 215c. Therefore, the generation of a crack or the disconnection, etc. in the conductive layer 215c may be effectively prevented or minimized.

Figure 11:
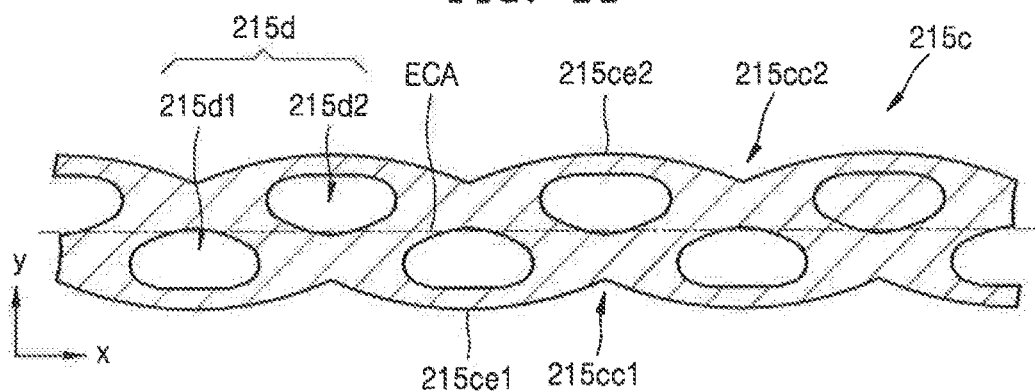
FIG. 11 is a plan view illustrating a portion of a display device according to an exemplary embodiment of the inventive concept.

In addition, this configuration may be applied to the display device according to the above embodiment described with reference to FIG. 9. In other words, as illustrated in FIG. 11, which is a plan view illustrating a portion of a display device according to an exemplary embodiment of the inventive concept, in addition to the configuration illustrated in FIG. 9, the first edge 215ce1 of the conductive layer 215c located on one side (−y direction) of the extension central axis ECA has the first concave portions 215cc1 corresponding to the plurality of second through holes 215d2, and the second edge 215ce2 of the conductive layer 215c located on the other side (+y direction) of the extension central axis ECA has the second concave portions 215cc2 corresponding to the plurality of first through holes 215d1.

Although the above embodiments illustrate that the plurality of through holes 215d have an approximately circular shape in a plan view, the inventive concept is not limited thereto. For example, the plurality of through holes 215d may have various shapes such as a quadrangular shape, a rhombus shape, a chamfered quadrangular shape, a chamfered rhombus shape, an elliptical shape, or a crushed circular shape in a plan view.

Figure 12:
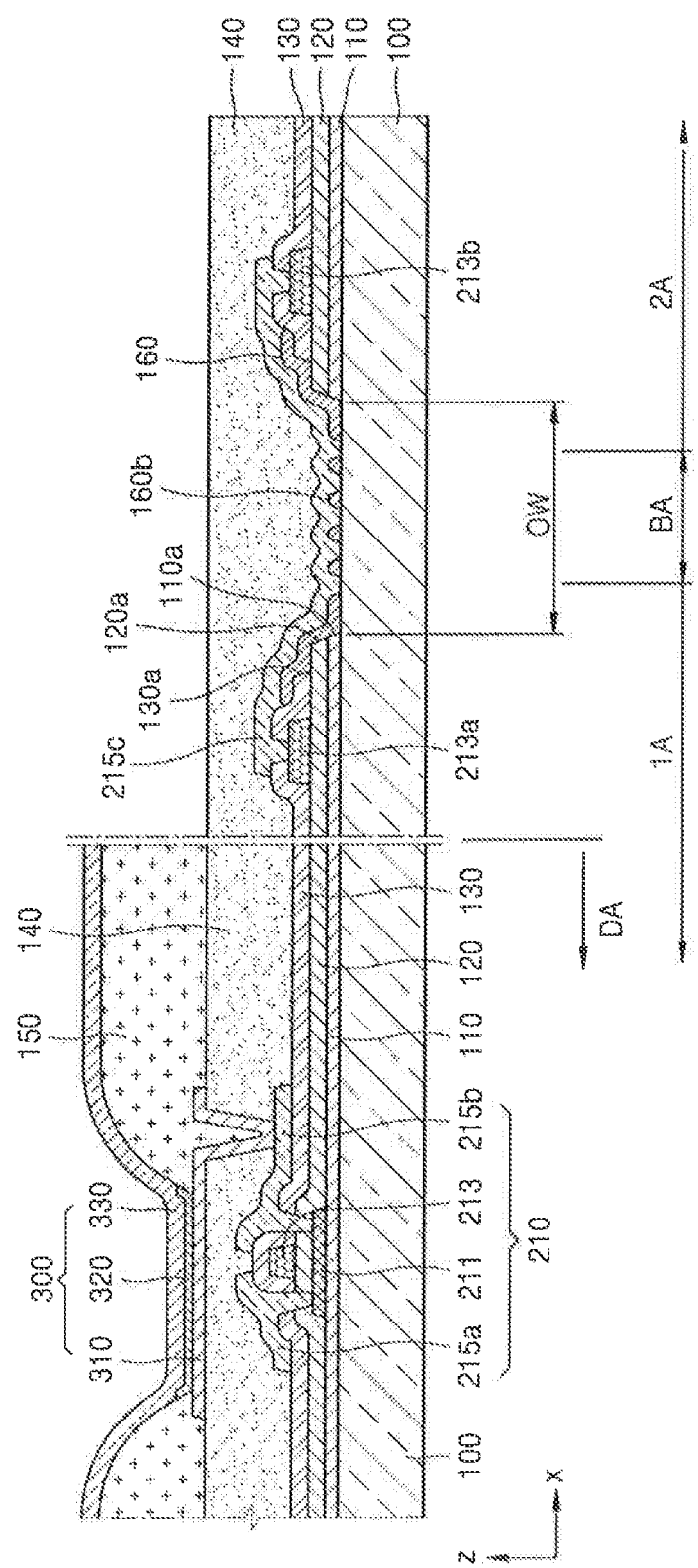
FIG. 12 is a cross-sectional view illustrating a portion of a display device according to an exemplary embodiment of the inventive concept.

FIG. 12 is a cross-sectional view illustrating a portion of a display device according to an exemplary embodiment of the inventive concept. The display device the present embodiment is different from the display device described with reference to FIG. 2 in that the organic layer 160 does not have an integral shape in the bending area BA but has a plurality of islands 160b filling a space between at least a portion of the inorganic insulating layer and spaced apart from each other. The plurality of islands 160b extend in the first direction (+y direction), in other words, the bending axis direction, and are spaced apart from each other in the second direction (+x direction) crossing the bending axis.

The conductive layer 215c covers the plurality of islands 160b and the shape of the upper surface of the conductive layer 215c over the plurality of islands 160b corresponds to the shape of the upper surface of the plurality of islands 160b and thus the surface area of the upper surface (+z direction) of the conductive layer 215c increases. In addition, in this configuration, the locations of the plurality of through holes 215d of the conductive layer 215c may be synchronized with the locations of the plurality of islands 160b.

In this case, the protrusions of the uneven surface 160a of the organic layer 160 in the above embodiments may be considered to correspond to the plurality of islands 160b of the organic layer 160 in the present embodiment. In addition, the concave portions between the protrusions of the uneven surface 160a of the organic layer 160 in the above embodiments may be considered to correspond to spaces between the plurality of islands 160b of the organic layer 160 in the present embodiment. In view of this, the configuration of the conductive layer 215c in the above embodiments is also applicable to the conductive layer 215c of the display device according to the present embodiment.

In other words, similar to that shown in FIG. 3, the locations of the plurality of through holes 215d may correspond to the plurality of islands 160b, or similar that shown in FIG. 4, the locations of the plurality of through holes 215d may correspond to spaces between the plurality of islands 160b, or similar to that shown in FIG. 5, the locations of the plurality of through holes 215d may correspond to both the spaces between the plurality of islands 160b and the plurality of islands 160b. In addition, the structure of the conductive layer 215c described with reference to FIGS. 6 to 11 is applicable to the conductive layer 215c of the display device illustrated in FIG. 12.

In addition, up to now, only the case where the inorganic insulating layer includes an opening has been described but the inventive concept is not limited thereto. For example, the inorganic insulating layer may include a groove. For example, in the structure illustrated in FIG. 2 or 12, the buffer layer 110 may not include an opening but instead include a shape that is continuous over the first region 1A, the bending area BA, and the second region 2A, and only the gate insulating layer 120 and the interlayer insulating layer 130 may have the opening 120a and the opening 130a, respectively. In this case, when the buffer layer 110, the gate insulating layer 120, and the interlayer insulating layer 130 are referred to as an inorganic insulating layer, the inorganic insulating layer may be understood to have a groove, and not an opening in the bending area BA. The opening 120a of the gate insulating layer 120 and the opening 130a of the interlayer insulating layer 130 may be formed via one patterning process. For example, when forming contact holes in the gate insulating layer 120 and the interlayer insulating layer 130, respectively, to allow the source electrode 215a and the drain electrode 215b of the TFT 210 to contact the semiconductor layer 211, the opening 120a and the opening 130a may be simultaneously formed. In this case, the inner surface of the opening 120a of the gate insulating layer 120 may coincide with the inner surface of the opening 130a of the interlayer insulating layer 130. In other words, the inner surface of the opening 120a of the gate insulating layer 120 and the inner surface of the opening 130a of the interlayer insulating layer 130 may form a continuous plane.

In this case, the organic layer 160 in the above embodiments may fill at least a portion of the groove of the inorganic insulating layer. In other words, the organic layer 160 including the uneven surface 160a may be located over the buffer layer 110 inside the bending area BA, or the organic layer 160 including the plurality of islands 160b spaced apart from each other may be located over the buffer layer 110 in the bending area BA. The structure of the conductive layer 215c in the above embodiments is applicable to this case.

Furthermore, a case where the inorganic insulating layer does not include an opening and a groove is also included in the scope of the inventive concept. For example, unlike the illustration of FIG. 2, like that shown in FIG. 13, the buffer layer 110, the gate insulating layer 120, and the interlayer insulating layer 130 may be continuous in the first region 1A, the bending area BA, and the second region 2A. In addition, the organic layer 160 is located over the substrate 100, for example, the interlayer insulating layer 130, and includes the uneven surface 160a in an upper surface thereof corresponding to the bending area BA. The uneven surface 160a may include a plurality of protrusions. The structure of the conductive layer 215c in the above embodiments is applicable to this case. In other words, the relation between the conductive layer 215c and the organic layer 160 in the above embodiments is applicable to this case.

Figure 13:
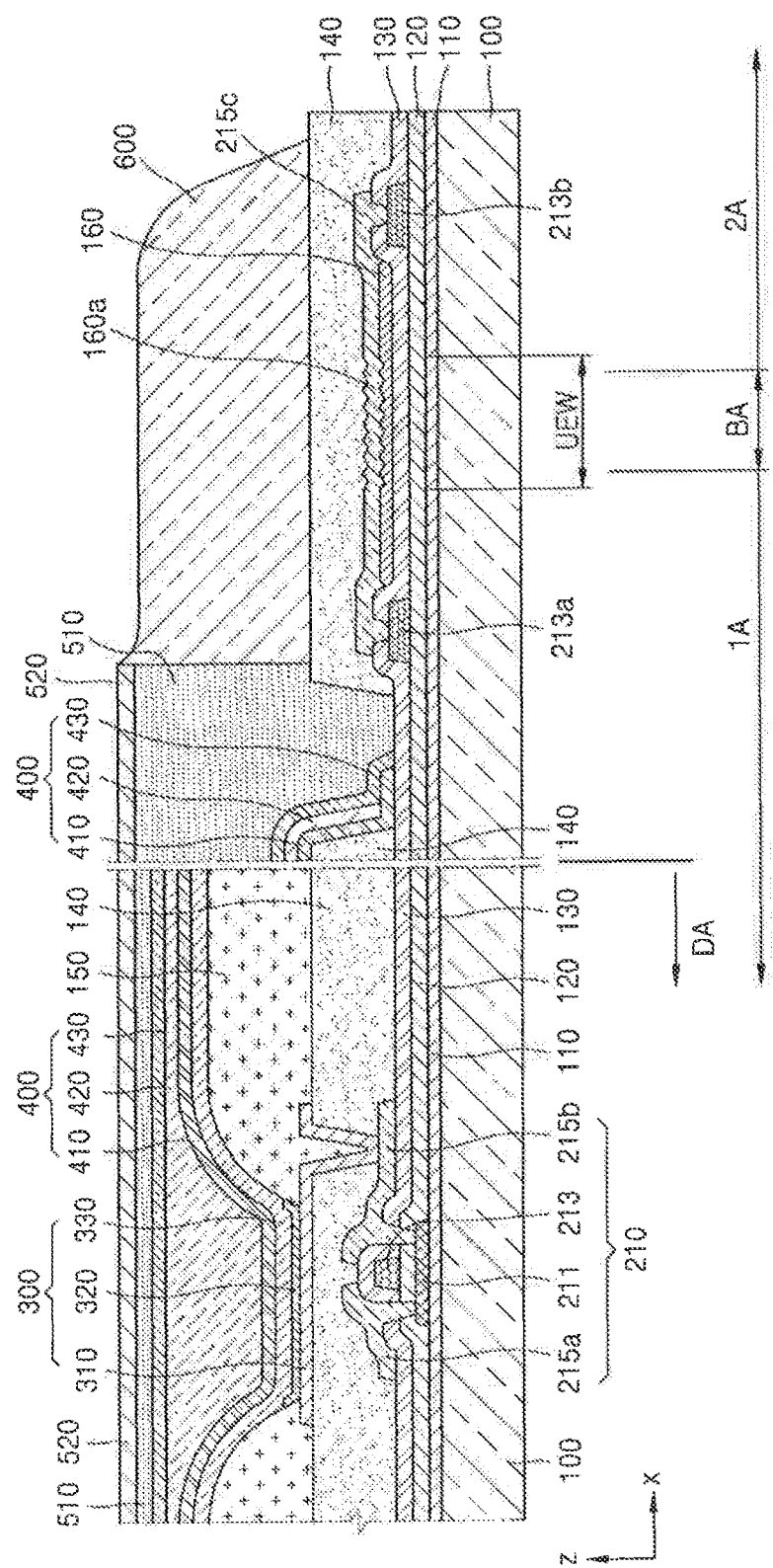
FIG. 13 is a cross-sectional view illustrating a portion of a display device according to an exemplary embodiment of the inventive concept.

In addition, the embodiment shown in FIG. 12 can be changed similar to that shown in FIG. 13. For example, the buffer layer 110, the gate insulating layer 120, and the interlayer insulating layer 130 in FIG. 12 can be changed to be continuous in the first region 1A, the bending area BA, and the second region 2A. In this case, the organic layer 160 including the plurality of islands 160b corresponding to at least the bending area BA and spaced apart from each other may be located over the substrate 100, for example, the interlayer insulating layer 130. The structure of the conductive layer 215c in the above embodiments is applicable to this case. In other words, the relation between the conductive layer 215c and the organic layer 160 in the above embodiments is applicable to this case.

Figure 14:
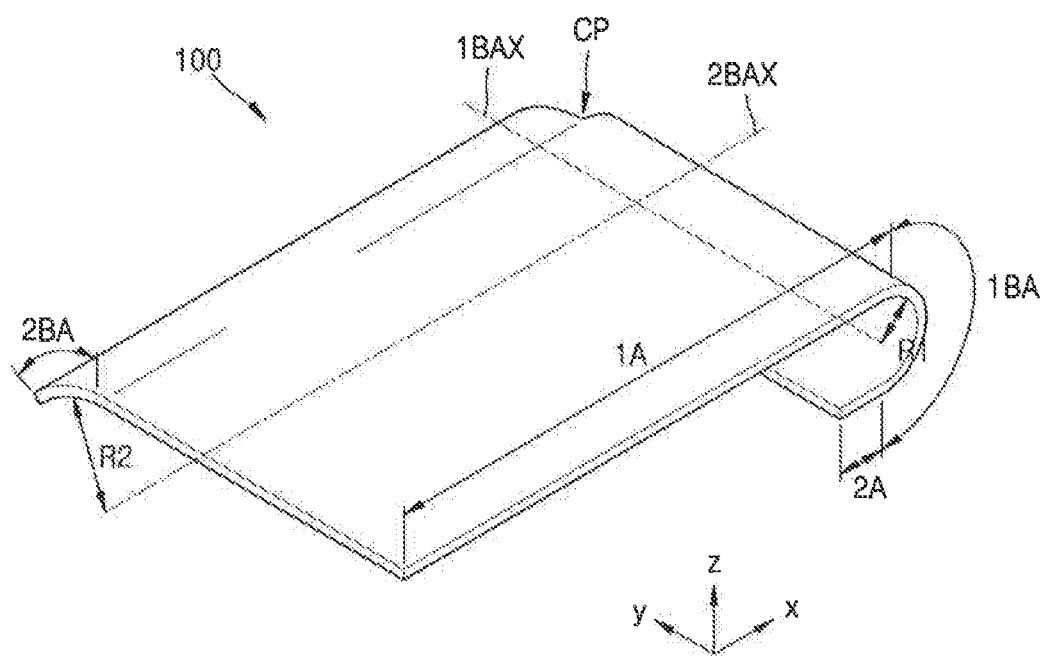
FIG. 14 is a perspective view illustrating a portion of a display device according to an exemplary embodiment of the inventive concept.

FIG. 14 is a perspective view illustrating a portion of a display device, for example, the substrate 100 according to an exemplary embodiment of the inventive concept. The bending area BA in the above embodiments is illustrated as a first bending area 1BA in FIG. 14 and the substrate 100 is bent around a first bending axis 1BAX in the first bending area 1BA.

Unlike the illustration of FIG. 1, the display device according to the present embodiment includes a second bending area 2BA in addition to the first bending area 1BA. The second bending area 2BA is located inside the first region 1A. For example, the substrate 100 is bent, in the first bending area 1BA, around the first bending axis 1BAX extending in the first direction (+y direction), and the substrate 100 is bent around a second bending axis 2BAX extending in the second direction (+x direction). In this case, the substrate 100 is chamfered at a corner adjacent to a portion at which the first bending axis 1BAX crosses the second bending axis 2BAX, and thus, the substrate 100 includes a chamfered portion (CP). Since the chamfered portion CP exists, the substrate 100 may be simultaneously bent around the first bending axis 1BAX and the second bending axis 2BAX crossing the first bending axis 1BAX.

In this case, a curvature radius R1 in the first bending area 1BA is less than a curvature radius R2 in the second bending area 2BA. This may mean that the second bending area 2BA is not bent as much compared to the first bending area 1BA. Therefore, in the second bending area 2BA in which the bending is slight, a tensile stress applied to elements of the display device is relatively less than a tensile stress applied to elements in the first bending area 1BA. Therefore, the inorganic insulating layer described in the above embodiments may be continuous in at least a portion including the second bending area 2BA of the first region 1A. Here, a configuration in which the inorganic insulating layer is continuous in at least the portion may mean that the inorganic insulating layer may have contact holes for electrically connecting with conductive layers located over/below the inorganic insulating layer inside the first region 1A. The contact holes, etc. have a circular shape, an elliptical shape, a square shape, or a shape similar thereto in a plan view, and an opening or groove may have a rectangular shape having a very high aspect ratio in a plan view. The inorganic insulating layer may have an opening or groove in the second bending area 2BA. In addition, the second bending area 2BA may include the organic layer 160 and the conductive layer 215c similar to the configuration described in the above embodiments.

Figure 15:
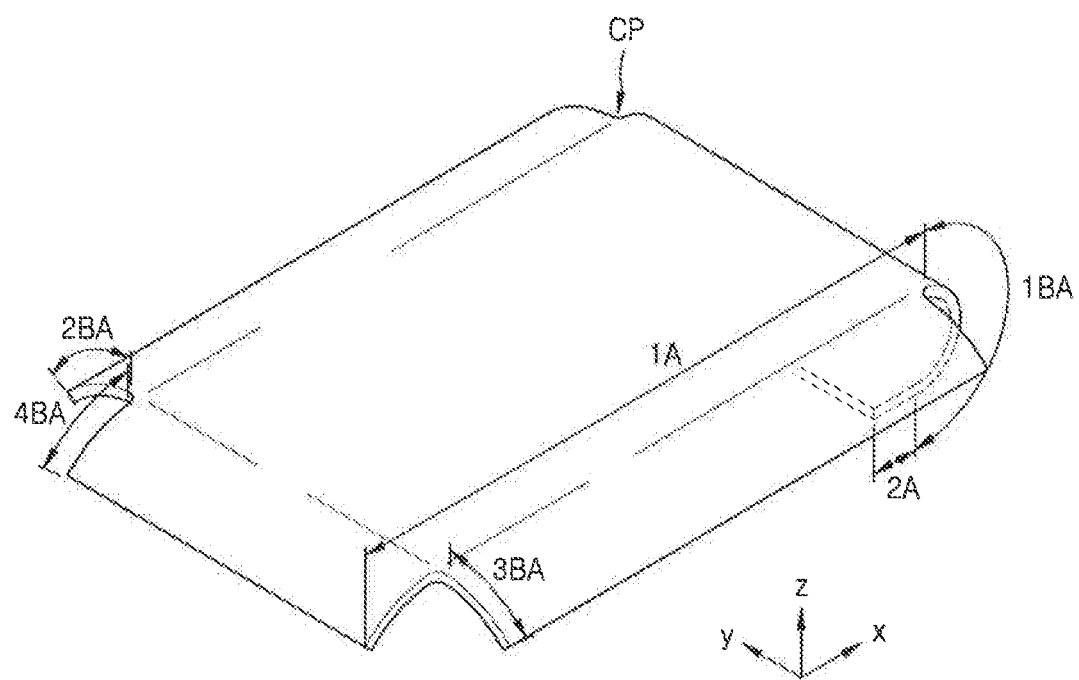
FIG. 15 is a perspective view illustrating a portion of a display device according to an exemplary embodiment of the inventive concept.

Although FIG. 14 illustrates that a display device includes only the second bending area 2BA in addition to the first bending area 1BA, the inventive concept is not limited thereto. For example, as illustrated in FIG. 15, which is a perspective view illustrating a portion of a display device according to an exemplary embodiment of the inventive concept, the display device may include a third bending area 3BA and a fourth bending area 4BA in addition to the first bending area 1BA and the second bending area 2BA. In the display device having four edges, all of the four edges may be bent. In this case, the third bending area 3BA and the fourth bending area 4BA may have the same/similar configuration as/to the second bending area 2BA.

The display device may allow a user to recognize that the area of a peripheral region in which an image is not displayed and a pad, etc. are located reduces when the user views a display surface of the display device. This is accomplished by configuring the display device to be bent in the second bending area 2BA to the fourth bending area 43A. Unlike the illustration of FIG. 14, the substrate may be bent in the fourth bending area 4BA at a same or similar curvature as that in the first bending area 1BA.

A display device according to an exemplary embodiment of the inventive concept can minimize the occurrence of a defect such as disconnection during a manufacturing process thereby increasing a lifetime of the display device.

While the inventive concept has been particularly shown and described with reference to exemplary embodiments thereof, it will be understood by those of ordinary skill in the art that various changes in form and details may be made therein without departing from the spirit and scope of the inventive concept as defined by the following claims.

What is claimed is:

1. A display device, comprising:
a substrate comprising a bending area located between a first region and a second region and bent around a bending axis in the bending area;
an organic layer disposed over the substrate, an upper surface of the organic layer comprising an uneven surface in the bending area, the uneven surface comprising a plurality of protrusions; and
a conductive layer extending from the first region to the second region across the bending area, the conductive layer being located over the organic layer and comprising a plurality of through holes.

2. The display device of claim 1, further comprising:
an inorganic insulating layer disposed over the substrate and comprising an opening or a groove in the bending area,
wherein the organic layer is disposed in a portion of the opening or the groove.

3. The display device of claim 1, wherein locations of the plurality of through holes correspond to locations of the plurality of protrusions.

4. The display device of claim 1, wherein locations of the plurality of through holes correspond to locations of a plurality of concave portions between the plurality of protrusions.

5. The display device of claim 1, wherein the plurality of through holes are arranged in a line in an extension direction of the conductive layer.

6. The display device of claim 5, wherein
a first edge of the conductive layer located on a first side of an extension central axis of the conductive layer comprises first concave portions corresponding to spaces between the plurality of through holes, and a second edge of the conductive layer located on a second side of the extension central axis of the conductive layer comprises second concave portions corresponding to the spaces between the plurality of through holes.

7. The display device of claim 6, wherein the first concave portions correspond one-to-one with the second concave portions.

8. The display device of claim 1, wherein
the plurality of through holes are arranged in an extension direction of the conductive layer and comprise a plurality of first through holes and a plurality of second through holes,
respective centers of the plurality of first through holes are located on a first side of an extension central axis of the conductive layer, and
respective centers of the plurality of second through holes are located on a second side of the extension central axis.

9. The display device of claim 8, wherein the plurality of first through holes and the plurality of second through holes are alternately disposed in the extension direction.

10. The display device of claim 9, wherein a first edge of the conductive layer located on the second side of the extension central axis comprises first concave portions corresponding to the plurality of second through holes, and a second edge of the conductive layer located on the first side of the extension central axis comprises second concave portions corresponding to the plurality of first through holes.

11. The display device of claim 1, wherein the plurality of through holes are arranged in an extension direction of the conductive layer and a lateral direction crossing the extension direction.

12. The display device of claim 11, wherein a number of the plurality of through holes arranged in the lateral direction changes in the extension direction.

13. The display device of claim 11, wherein n through holes in the lateral direction and m through holes in the lateral direction are alternately arranged in the extension direction, wherein each of n and m is a natural number and n is different from m.

14. A display device, comprising:
a substrate comprising a bending area located between a first region and a second region and bent around a bending axis in the bending area;
an organic layer disposed over the substrate and comprising a plurality of islands spaced apart from each other and disposed in the bending area; and
a conductive layer extending from the first region to the second region across the bending area, the conductive layer being located over the organic layer and comprising a plurality of through holes, locations of the plurality of through holes being synchronized to locations of the plurality of islands.

15. The display device of claim 14, further comprising:
an inorganic insulating layer disposed over the substrate and comprising an opening or a groove in the bending area,
wherein the organic layer is disposed in a portion of the opening or the groove.

16. The display device of claim 14, wherein each of the plurality of islands extends in a bending axis direction and the plurality of islands are spaced apart from each other in a direction crossing the bending axis direction.

17. The display device of claim 14, wherein locations of the plurality of through holes correspond to locations of the plurality of islands.

18. The display device of claim 14, wherein locations of the plurality of through holes correspond to locations of spaces between the plurality of islands.

19. The display device of claim 14, wherein the plurality of through holes are arranged in a line in an extension direction of the conductive layer.

20. The display device of claim 19, wherein a first edge of the conductive layer located on a first side of an extension central axis of the conductive layer comprises first concave portions corresponding to spaces between the plurality of through holes, and a second edge of the conductive layer located on a second side of the extension central axis of the conductive layer comprises second concave portions corresponding to the spaces between the plurality of through holes.

21. The display device of claim 20, wherein the first concave portions correspond one-to-one, with the second concave portions.

22. The display device of claim 14, wherein the plurality of through holes are arranged in an extension direction of the conductive layer and comprise a plurality of first through holes and a plurality of second through holes,
respective centers of the plurality of first through holes are located on a first side of an extension central axis of the conductive layer, and
respective centers of the plurality of second through holes are located on a second side of the extension central axis.

23. The display device of claim 22, wherein the plurality of first through holes and the plurality of second through holes are alternately disposed in the extension direction.

24. The display device of claim 23, wherein a first edge of the conductive layer located on the second side of the extension central axis comprises first concave portions corresponding to the plurality of second through holes, and a second edge of the conductive layer located on the first side of the extension central axis comprises second concave portions corresponding to the plurality of first through holes.

25. The display device of claim 14, wherein the plurality of through holes are arranged in an extension direction of the conductive layer and a lateral direction crossing the extension direction.

26. The display device of claim 25, wherein a number of the plurality of through holes arranged in the lateral direction changes in the extension direction.

27. The display device of claim 25, wherein n through holes in the lateral direction and in through holes in the lateral direction are alternately arranged in the extension direction, wherein each of n and m is a natural number and n is different from m.

28. The display device of claim 1, wherein locations of the plurality of through holes are synchronized to locations of the plurality of protrusions.

* * * * *